United States Patent [19]
Nakanishi

[11] Patent Number: 5,945,702
[45] Date of Patent: Aug. 31, 1999

[54] SEMICONDUCTOR MEMORY DEVICE WITH PERIPHERAL DUMMY CELL ARRAY

[75] Inventor: Nobuko Nakanishi, Kanagawa, Japan

[73] Assignee: NEC Corporation, Tokyo, Japan

[21] Appl. No.: 08/971,747

[22] Filed: Nov. 17, 1997

[30] Foreign Application Priority Data

Nov. 19, 1996 [JP] Japan ...................................... 8-308079

[51] Int. Cl.$^6$ .......................... H01L 27/108; H01L 29/76; H01L 29/94; H01L 31/119
[52] U.S. Cl. ........................... 257/296; 257/303; 257/306
[58] Field of Search ..................................... 257/296–310, 257/401; 438/698, 703, 239, 243–253, 396–400; 365/210, 69

[56] References Cited

U.S. PATENT DOCUMENTS 5,062,077 10/1991 Takashima et al. ..................... 365/210
5,361,234 11/1994 Iwasa ....................................... 365/210
5,488,007 1/1996 Kim et al. ............................... 438/698

FOREIGN PATENT DOCUMENTS 2-177558 7/1990 Japan .
6-76594 3/1994 Japan .

Primary Examiner—Tom Thomas
Assistant Examiner—Cuong Q Nguyen
Attorney, Agent, or Firm—Young & Thompson

[57] ABSTRACT

A cell array of a semiconductor memory device having a memory cell section and a dummy cell section for the assurance of the accuracy of the fabrication of a photoresist pattern for the memory cell section. MOS transistors within the dummy cell section constitutes a part of sense amplifiers in the cell drive circuit.

10 Claims, 6 Drawing Sheets

SEMICONDUCTOR MEMORY DEVICE WITH PERIPHERAL DUMMY CELL ARRAY

BACKGROUND OF THE INVENTION (a) Field of the Invention

The present invention relates to a semiconductor memory device and, more particularly, to a semiconductor memory device having a dummy cell pattern in addition to a memory cell pattern.

(b) Description of the Related Art

A semiconductor memory device comprises a cell array area in which cell transistors are arranged in row and column directions for storing information and a plurality of associated basic patterns constituting a drive circuit including sense amplifiers and sub-word decoders.

FIG. 1 shows an example of the conventional semiconductor memory device having a cell array block of a stacked capacitor structure. The cell array block 13 comprises a memory cell section 12 in which a plurality of memory cell patterns 12a are arranged in a matrix on a semiconductor substrate and a dummy cell section 11A in which a plurality of dummy cell patterns 11b are disposed in the peripheral area surrounding the memory cell section 12 on the semiconductor substrate.

Outside the dummy cell pattern area 11A, there is provided a drive circuit section 14 in which sub-word decoders 14a are disposed in the vicinities of the top and bottom edges of the memory device and sense amplifiers 14b are disposed in the vicinities of the left and right edges of the memory device, and other driving circuits 14c disposed in the vicinity of four corners of the memory device.

FIG. 2A is a partial enlarged top plan view taken in the vicinities of line X—X in FIG. 1, and FIG. 2B is a cross-sectional view taken along line X—X for showing some mask patterns for multiple layers overlaid in photolithographic processes in the fabrication of the semiconductor memory device. In FIG. 2A, the memory device comprises diffused regions formed in a silicon substrate, word lines 16 formed as gate lines for pairs of the diffused regions 15, digit lines 17 overlying the word lines 16 and connected to one of the pairs of diffused regions 15. A contact 18 connects the other of pair of diffused regions 15 with a lower poly-Si electrode 22 of a stacked capacitor. An overall area shown in FIG. 2A or the cell array area 13 in FIG. 1 is provided with an upper poly-Si layer 20 as the other electrode for the stacked capacitor.

In FIG. 2B, the memory cell pattern section 12, the dummy cell pattern section 11A and the drive section 14 are shown by separating these regions by dotted lines.

The dummy cell pattern is provided because of the following reasons. In the photolithographic process for LSI wafer processing, an incident light to the wafer from an exposure unit and a reflected light generated from the incident light interfere each other during a photoresist exposure step. The wavelength, amplitude and cycle of both incident and reflected lights are the same but in opposite directions in these lights, thereby generating a standing wave which does not travel in any direction. The amplitude of the standing wave differs depending on the phase of the incident light at the reflection point, and assumes at a maximum 2 times the incident wave. In such an area where the standing wave exists, the shape of pattern transferred on the photoresist layer suffers from an adverse effect. Particularly, its effect is larger for the stacked poly-Si pattern without a dummy cell pattern because the cell pattern has a smaller dimension at an array edge of the memory pattern area 12 due to the following reason.

The memory cell pattern area 12 has a high density in lower conductive layers. Due to this reason, the surface is normally raised higher in the cell pattern area 12 than in the sub-word decoder 14a and the sense amplifiers 14b disposed in the peripheral area. The structure of the stacked poly-Si layer 22 and the capacitor poly-Si layer 20 disposed above the memory cell pattern area 12 causes a large thickness difference between the memory pattern area 12 and the drive circuit area 14.

FIG. 3A is a cross-sectional view of a semiconductor memory device without having the dummy cell pattern during an exposure step in a stacked poly-Si pattern fabrication process thereto. The cell array area 13 consists of the memory cell pattern area 12, and the cell drive circuit 14 is disposed in the outer peripheral area. A stacked poly-Si layer 22 and a photoresist layer 24 are formed on the entire surface of the underlying structure formed on a wafer 25. A reticle 23 is attached on an exposure unit to transfer a desired poly-Si pattern on the photoresist 24. Here, an incident light from the exposure unit to the cell array peripheral area 12c is denoted by 27 and an incident light to the central cell array area is denoted by 28. A photoresist area 24 is exposed and removed after development if a positive type photoresist is used in the area where a light is exposed. Other area masked with chrome etc. is left as a necessary pattern.

In FIG. 3A, the stacked poly-Si pattern at the cell array peripheral area 12c is denoted by 30 and the stacked poly-Si pattern in the cell array central area 12d is denoted by 31. The surface of cell array peripheral area 12c is disposed lower than the surface of the cell array central area 12d by a gap of "h". Usually, in this condition, the stacked poly-Si pattern 30 at the cell array peripheral area 12c becomes thinner than the stacked poly-Si pattern 21 in the central area 12d.

Referring to FIG. 3B showing waveforms of the light incident to the memory device, i1 denotes the light incident to the cell array peripheral area 12c and j1 the light incident to the cell array central area 12c Both i1 and j1 travel with their respective amplitudes B, cycles T and wavelengths λ to arrive at respective reflecting points. Y axis or horizontal direction in the drawing denotes displacement during the travel, and X axis or vertical direction in the drawing denotes wavelengths of the lights. The reflecting point where the wave i1 incident to the cell array edge area is denoted as "k", the reflecting point where the wave j1 incident to the cell array central area is denoted by "m". The location of the reflection point "m", at the cell array central area 12d is raised by a difference "h" from the reflecting point "k" at the cell array peripheral area 12c.

There is no displacement of the incident wave j1 at the reflecting point "m", whereas a displacement of the incident wave i1 at the reflecting point "k" is −B. The phase of i1 is 5/4λ deviated from the phase of the incident wave j1 at the reflecting point "m". As a result, a complex wave or standing wave at the respective reflecting points of incident wave i1 and incident wave j1 show different phases.

Here, reflected wave generated from the incident wave i1 at the reflecting point "k" is denoted by i2, and reflected wave generated from the incident wave i1 at the reflecting point "m" is denoted by j2. The waveform of the reflected wave i2 overlaps with the waveform of the incident wave i1 and the waveform of the reflected wave j2 shifts by λ/2 in phase from the incident wave j1. The composite wave made from the incident wave i1 and the reflected wave i2 assumes waveform I which has a displacement of 2B or 2 times that of the incident wave i1 at the cell array peripheral area 12c. The composite wave made from the incident wave j1 and the reflected wave j2 assumes waveform J which is of a straight line after the incident wave j1 and the reflected wave j2 are cancelled by each other at the cell array central area 12c. As a result, the cell array central area 12d is less influenced than the cell array peripheral area.

If the driving circuit block 14 is in direct contact with the memory cell section 12 (in this case, it equals to the cell array block 13), it results in the reduction of the dimension of the cell pattern at the cell array peripheral area 12c, causing a storage failure or loss of information stored. In FIG. 1, the dummy cell pattern area 11A disposed at the outer periphery of the cell array area is provided for prevention of the deterioration of the stacked poly-Si transfer accuracy caused by the standing wave at the memory pattern peripheral area 12.

In a conventional semiconductor memory device having the dummy pattern area disposed on outer periphery of the memory pattern area 12, the dummy cell area is generally designed so that it does not protrude into the drive circuit area 14 disposed on the further outer area in which the sub-word decoder 14a, the sense amplifier 14b and their drive circuit 14c are provided.

FIG. 3C is a cross-sectional view in an exposure process in the fabrication of stacked poly-Si pattern for the semiconductor memory device having the dummy cell pattern area 11A for the improvement of photoresist transfer accuracy. The dummy cell pattern area 11A is provided in the outer peripheral area 12c of the memory cell pattern area 12. The incident wave 29 is irradiated on the dummy pattern area 11A in which the dummy cell pattern 11b is disposed. There step-difference "h" is removed between the array central area 12d and the array edge area 12c by the deposition of the dummy cell pattern 11b in the memory pattern area 12. As a result, smaller dimension of the cell pattern is prevented which is generally caused by the standing wave due to the wave 27 incident to the stacked poly-Si pattern 20 in the array peripheral area 12.

The cell array area 13 in FIG. 3C, comprising the memory cell section 12, the dummy cell section 11A surrounding the memory cell section 12 and the cell drive circuit 14 disposed outside the dummy cell section. Inaccurate pattern transfer of the photoresist due to the standing wave is prevented during the fabrication of stacked poly-Si pattern at the peripheral area 12c of the cell array 13 in a conventional method by adding the dummy cell pattern area 11A. The structure, however, involves a smaller dimension of the memory device.

SUMMARY OF THE INVENTION

It is therefore, an object of the present invention to reduce the size of a semiconductor memory device having a dummy cell array for the assurance of the transfer accuracy of photoresist pattern deposition in the memory cell array A semiconductor device according to the present invention comprises a semiconductor memory cell device comprising a cell array including a memory cell array section having a plurality of memory cells arranged in a matrix for storing information and a dummy cell array section having a plurality of dummy cells arranged in an outer peripheral area of the memory cell array section, each of the memory cells including a memory cell transistor and a storage capacitor having a bottom electrode and a top electrode both overlying the memory cell transistor for storing electric charge supplied from the memory cell transistor, the dummy cells including a dummy cell transistor having a configuration substantially the same as a configuration of the memory cell transistors, at least a part of the dummy cell transistors constituting a driver circuit, for driving the memory cell section.

In a preferred embodiment, a cell array of a semiconductor memory device comprises a memory cell section and a dummy cell section for the assurance of the accuracy of the fabrication of a photoresist pattern for the memory cell section. MOS transistors within the dummy cell section constitutes a part of sense amplifiers in the cell drive circuit.

According to the present invention, photoresist transfer inaccuracy by the standing wave during exposure can be prevented without increasing the size of a cell array area.

The above and other objects, features and advantages of the present invention will be more apparent from the following description, referring to the accompanying drawings.

PREFERRED EMBODIMENTS OF THE INVENTION

Figure 1:
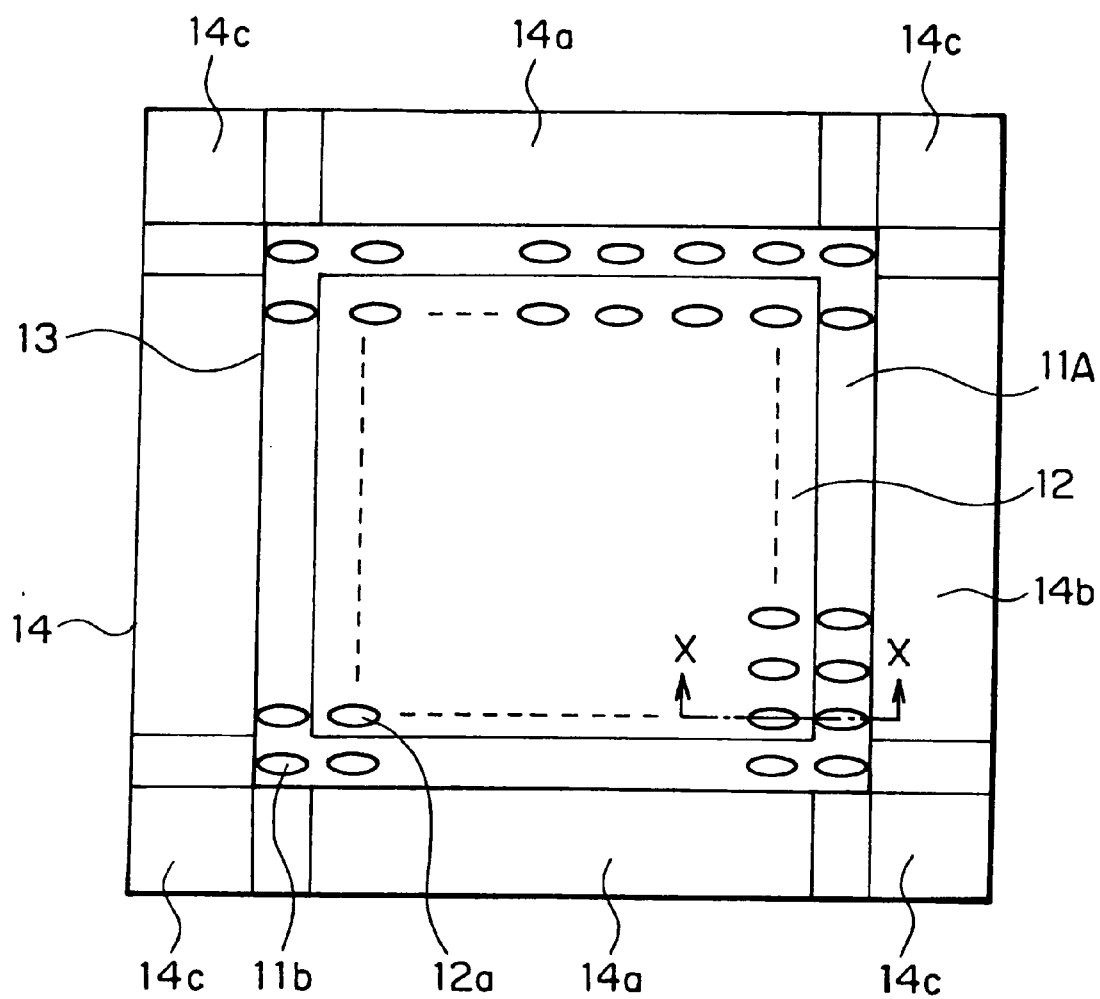
FIG. 1 is a top plan view of a conventional semiconductor memory device.

Now, the present invention is more specifically described with reference to the accompanying drawings, wherein similar constituent elements are designated by the same or similar reference numerals throughout the drawings.

Figure 4:
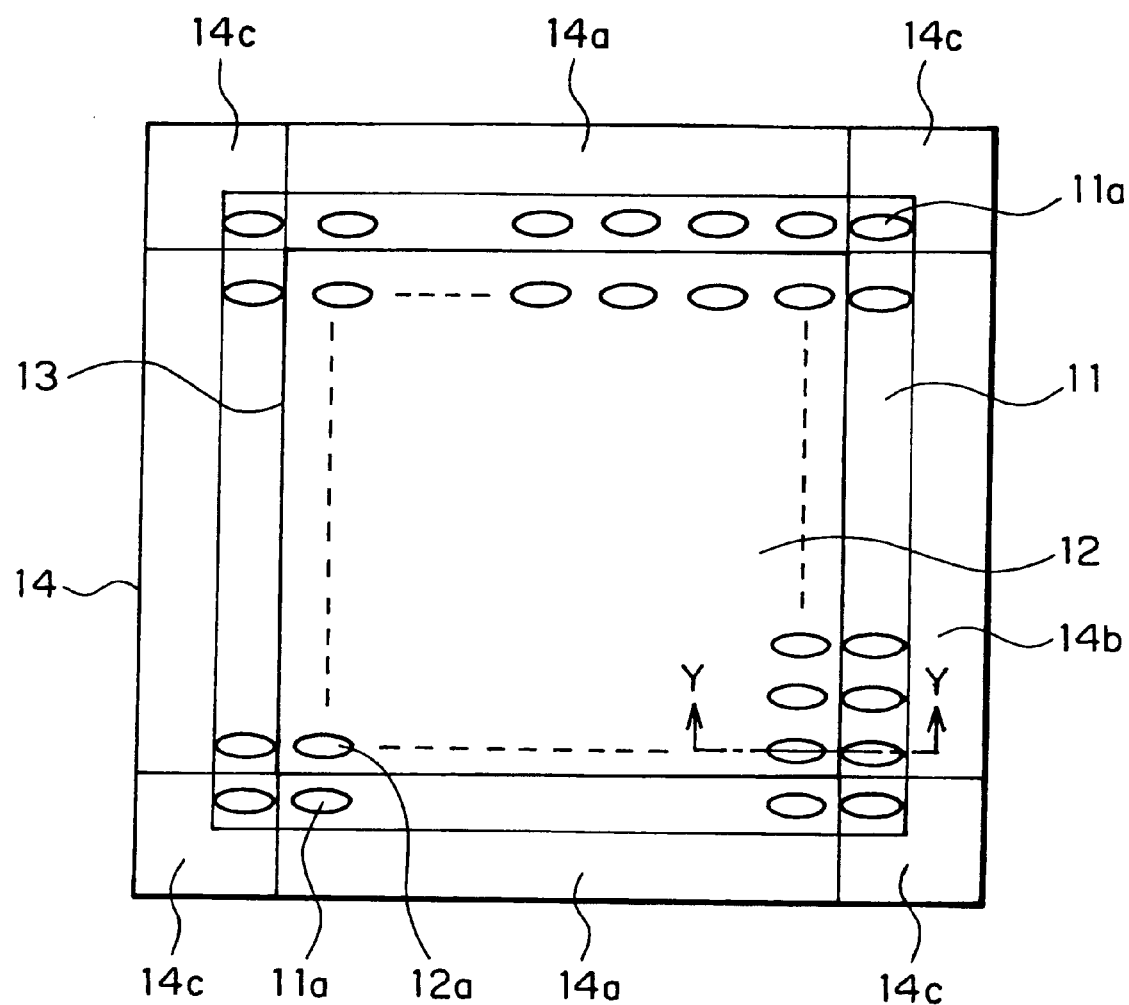
FIG. 4 is a top plan view of a semiconductor memory device according to an embodiment of the present invention.

Referring to FIG. 4, a semiconductor memory device according to an embodiment of the present invention comprises a cell array area 13 and a peripheral area 14 surrounding the cell array area 13. The peripheral area 14 includes a dummy cell section 11 constituting a sense amplifier and a drive section including a subword decoder 14a, a sense amplifier 14b and a drive circuit 14c.

Figure 2A:
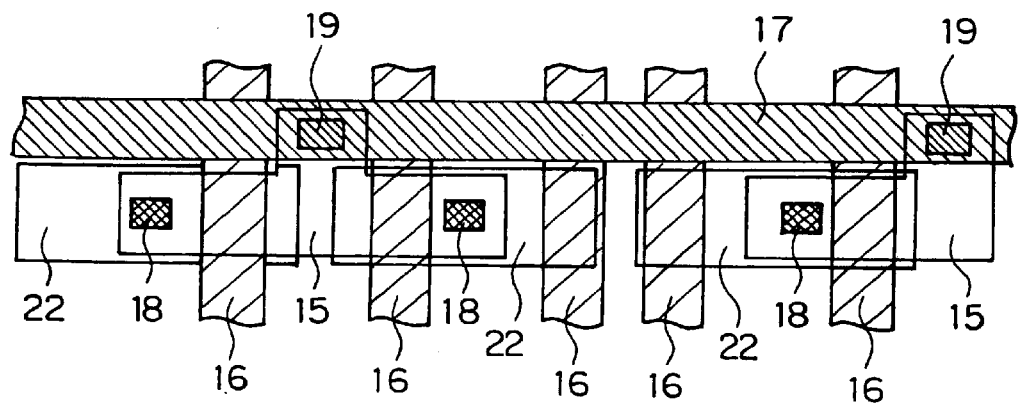
FIG. 2A is an enlarged top plan view of the semiconductor memory device of FIG. 1 in the vicinity of line X—X in FIG. 1.
Figure 2B:
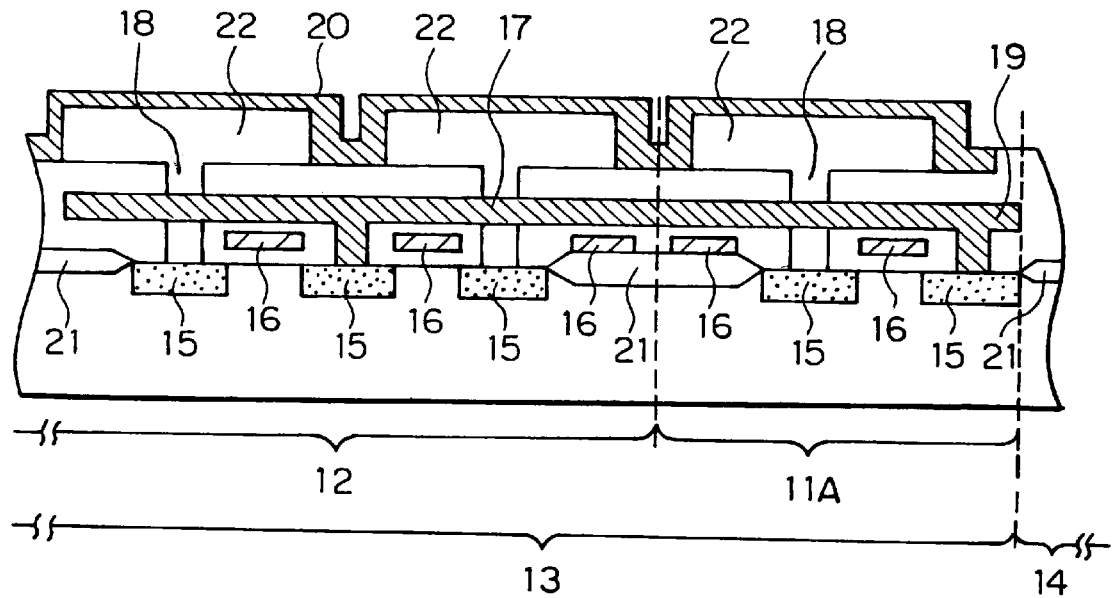
FIG. 2B is a cross-sectional view of the semiconductor memory device of FIG. 1 taken along line X—X.
Figure 5A:
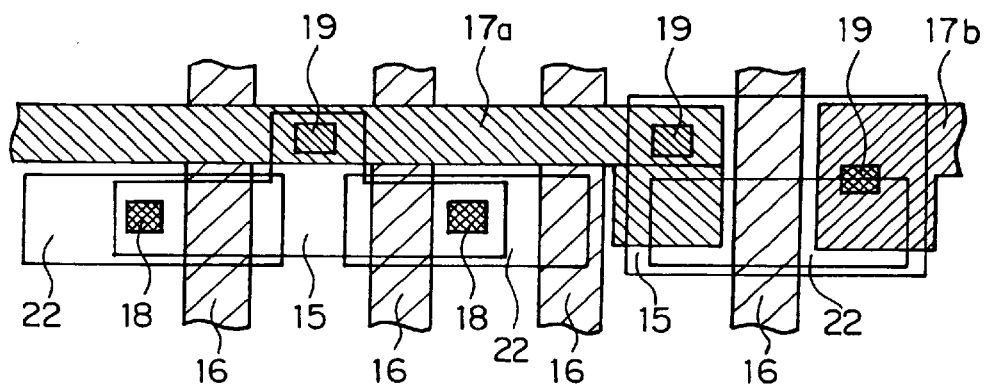
FIG. 5A is an enlarged top plan view of the semiconductor memory device of FIG. 4 in the vicinity of line Y—Y in FIG. 4.
Figure 5B:
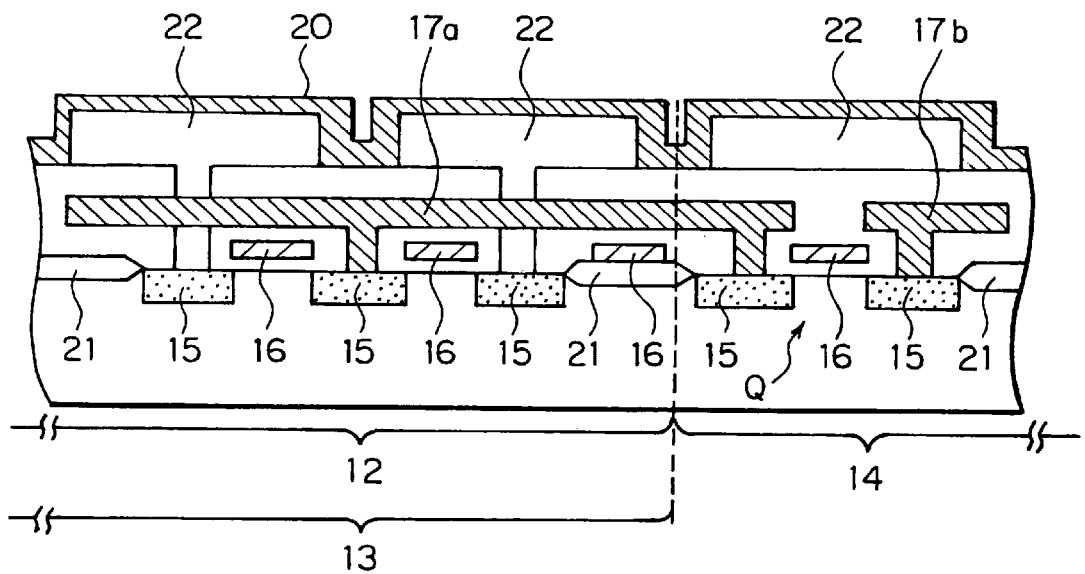
FIG. 5B is a cross-sectional view of the semiconductor memory device of FIG. 4 taken along line Y—Y.

Referring to FIG. 5A and FIG. 5B, the memory device of the present embodiment comprises diffused regions 15 formed in a silicon substrate, word lines 16 formed as gate lines for pairs of the diffused regions 15, digit lines 17 overlying the word lines 16 and connected to one of the pairs of diffused regions 15. A contact 18 connects the other of pair of diffused regions 15 with a lower poly-Si electrode 22 of a stacked capacitor. The digit line 17 is connected with the diffused region 15 by an interconnect 19. An overall area shown in FIG. 2A or the cell array area 13 in FIG. 1 is provided with an upper poly-Si layer 20 as the other electrode for the stacked capacitor.

In the MOS transistor Q formed by the dummy cell pattern constituting the dummy cell section 11, one of n$^+$ source/drain diffused regions 15 is connected with a poly-Si digit line 17a extending from a memory cell section 12 through a contact 19. The other of n$^+$ diffused regions 15 is connected with a poly-Si digit line 17b extending toward a cell drive section 14 including sense amplifiers and their drivers through a contact 19.

Figure 3A:
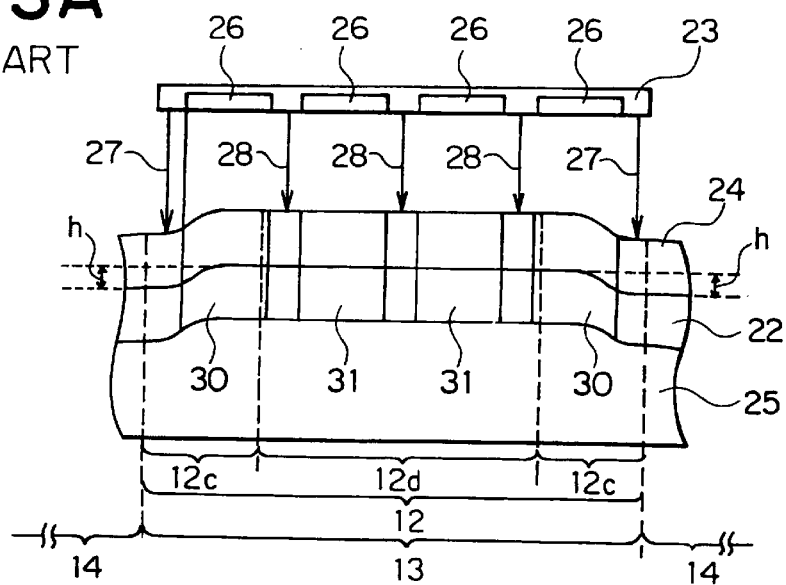
FIG. 3A is a cross-sectional view of another semiconductor memory device without having a dummy cell section during an exposure step for a stacked poly-Si pattern.
Figure 3B:
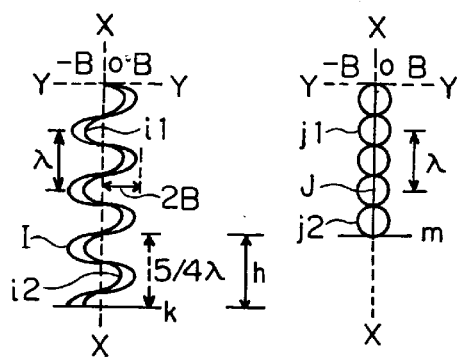
FIG. 3B is schematic diagrams of waveforms of lights in a memory cell section and a dummy cell section.
Figure 3C:
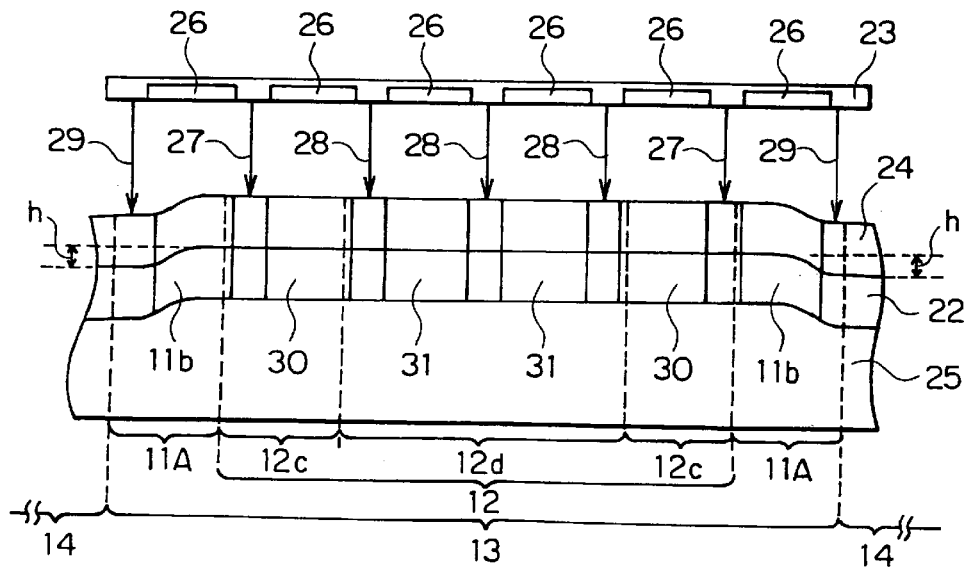
FIG. 3C is a cross-sectional view of the semiconductor memory device of FIG. 3A during an exposure step for a stacked poly-Si pattern.

The transistor Q in the dummy cell pattern 11a is covered, similarly to the transistors disposed within the memory cell section 12 by a silicon oxide film, and a stacked capacitor is disposed thereon by stacking a stacked poly-Si 22, an insulation film not shown, and a capacitor poly-Si 20. The height of the dummy cell section 11 and the height of the memory cell section 12 are approximately the same. However, according to the present embodiment, neither of the two n$^+$ diffused regions 15 of the transistor Q in the dummy cell pattern 11a is connected to the stacked poly-Si capacitors 20. As shown in FIGS. 3A and 3B, in the conventional semiconductor memory device, one of the two n$^+$ diffused regions 15 of the transistor in the dummy cell section 11b is connected to the digit line 17 extending from the memory cell pattern area 12 and the other n$^+$ diffused region 15 is connected to the stacked poly 12 of the stacked capacitor, similarly to the transistors in the memory cell section 12.

According to the present embodiment, one of the two n$^+$ diffused regions 15 of the dummy transistor Q in the dummy cell section 11a is connected to the digit line 17a extending from the memory cell section 12 and the other of the n$^+$ diffused regions is connected to the poly-Si digit line 17b of the sense amplifier 14b. The dummy transistors Q are arranged in the same pitch as the memory cells in the memory cell section 12. According to the present embodiment, the height of dummy cell section 11 is raised not only to equalize the heights of both the cell array sections but also to use the dummy transistors as part of the cell driver 14 having the sense amplifier 14b. By using the dummy transistors in the dummy cell section 11 for the cell driver 14, the cell array area 13 is composed of memory cell section 12 without increasing the size of the memory device, while the memory cell pattern at the periphery of the cell array area 13 is protected against the adverse influence of the standing wave.

For example, in the case of m=64 columns and n=128 rows in a memory matrix and a single column and a single row dummy cells are provided at the periphery of the matrix In the conventional semiconductor memory device in FIG. 3A, the dummy cell section 11A is disposed in the outer periphery of the cell array area. The area of the cell array area 13 comprising the memory cell section 12 and the dummy cell section 11 in the conventional memory device is calculated as follows:

(m+2)×(n+2)=(64+2)×(128+2)=66×130

On the other hand, according to the present embodiment, the area of the cell array area 13 comprising the memory cell section 12 is calculated as follows:

m×n=64×128

As a result, the area of the cell array area in the present embodiment can be reduced compared to the conventional cell array area as follows:

$$M \times n / (m+2) \times (n+2) = 64 \times 128 / 66 \times 130$$
$$= 8192/8580$$
$$= 0.954778554$$

This means that the size of memory cell array area can be reduced by 4.5% in the present embodiment.

In the above embodiment, the dummy transistor is used as part of the cell driver. The dummy transistors in the peripheral area can be used for replacing 80–90% of redundancy cells for better efficiency. A plurality of the dummy cell rows or columns may be provided so long as the memory cell pitch in the dummy cells is identical with the memory cell pitch in the memory cells.

For the implementation of the present embodiment, the dummy transistors Q in the dummy cell section are connected with other circuit constituents in the cell driver 14. However, it is preferable to provide a specific connection scheme in view that one or more row or column of dummy cell section 11a are disposed in the same pitch as the memory cell pattern 12a in the memory cell section 13. The specific connection includes a contact layout for the sense amplifiers in the dummy cell pattern area integrated with as part of the cell driver 14. The contact is used for connecting between the layers formed before and after the stacked poly-Si layers. Because of the fabrication process, if the dummy cell pattern is arranged at the location where the contact is provided for the sense amplifier of the cell driver 14, a short-circuit failure occurs between the interconnect layer connected with the contact and the dummy cell pattern.

Figure 6A:
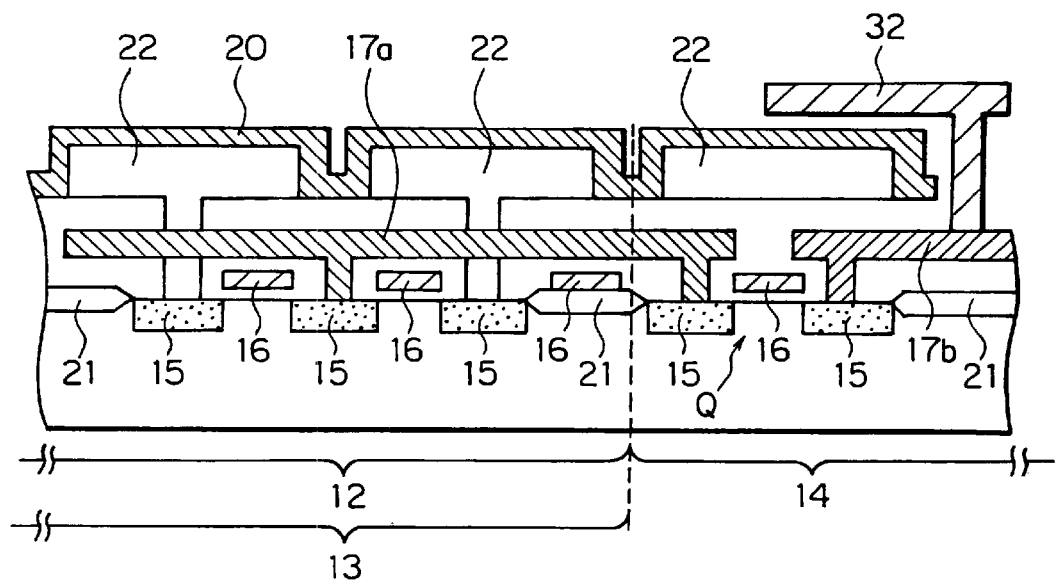
FIG. 6A is an enlarged top plan view of the semiconductor memory device of FIG. 4 in the vicinity of line Y—Y in FIG. 4; and, FIG. 6B is a cross-sectional view of the semiconductor memory device of FIG. 4 in the vicinity of line Y—Y in FIG. 4.

FIG. 6A shows an example wherein the dummy cell pattern is disposed at the location where a contact is disposed for connection of n$^+$ diffused regions 15 formed before the stacked poly-Si layer process and an aluminum interconnect 32 after the stacked poly-Si layer process. As shown in the figure, the diffused region 15 and the aluminum interconnect 32 are connected by the contact. The dummy cell pattern disposed therein causes a short-circuit failure between the aluminum interconnect 32 and the stacked poly-Si 22.

Figure 6B:
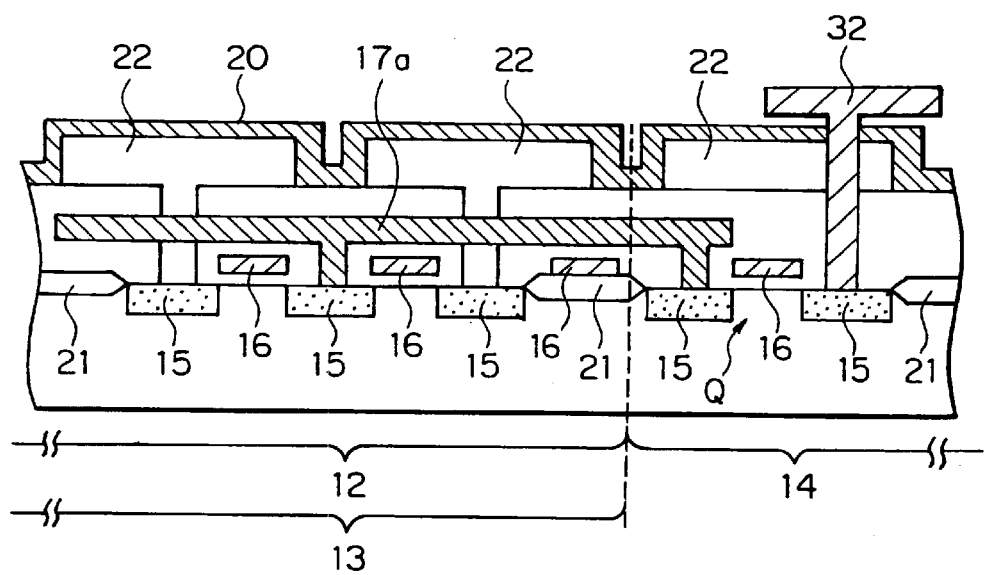

FIG. 6B is a cross-sectional view for showing a resolution of the short circuit failure. The aluminum interconnect 32 is connected to the poly-Si digit line 17 in the dummy cell section similarly to the memory cell section connected to the diffused region 15.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory cell device comprising a cell array including a memory cell array section having a plurality of memory cells arranged in a matrix for storing information, said memory cell array section having an outer peripheral perimeter, and a dummy cell array section having a plurality of dummy cells arranged in areas adjacent all sides of said outer peripheral perimeter of said memory cell array section, each of said memory cells including a memory cell transistor and a storage capacitor having a bottom electrode and a top electrode both overlying said memory cell transistor for storing electric charge supplied from said memory cell transistor, each of said dummy cells including a dummy cell transistor having a configuration substantially the same as a configuration of said memory cell transistors, and a driving circuit comprising dummy cells, for driving said memory cell section.

2. A semiconductor memory device as defined in claim 1, wherein said top electrodes of said storage capacitors have a substantially uniform surface extending between said memory cell section and said dummy cell section.

3. A semiconductor memory device as defined in claim 1, wherein each of said dummy cells further includes a dummy storage capacitor overlying said dummy cell transistor for storing electric charge supplied from said dummy cell transistor, said dummy cell constituting redundant memory cells for said memory cells.

4. A semiconductor memory device as defined in claim 1, wherein said storage capacitor is of a stacked type.

5. A semiconductor memory device as defined in claim 1, wherein each said dummy cells further includes a storage capacitor, and is arranged as a part of the matrix of said memory cells at a constant pitch.

6. A semiconductor memory device as defined in claim 5, wherein each said dummy transistor comprising said driving circuit has a first diffused region connected to a digit line of said memory cell array and a gate connected to a word line of said memory cell array.

7. A semiconductor memory device as defined in claim 6, wherein each said dummy cell comprising said driving circuit transistor has a second diffused region connected through a first interconnect layer to a second interconnect layer disposed as overlying said storage capacitor, said first interconnect layer underlying said storage capacitor.

8. The semiconductor memory device of claim 3, wherein each of said dummy cell transistors comprise two diffusion regions free of contact with a bottom electrode of the corresponding overlying dummy storage capacitor.

9. The semiconductor memory device of claim 6, wherein each said dummy cell transistor comprising said driving circuit further comprises a second diffusion region connected to a digit line of a sense amplifier.

10. A semiconductor memory cell device comprising a cell array including a memory cell array section having a plurality of memory cells arranged in a matrix for storing information and a dummy cell array section having a plurality of dummy cells arranged in an outer peripheral area of said memory cell array section, each of said memory cells including a memory cell transistor and a storage capacitor having a bottom electrode and a top electrode both overlying said memory cell transistor for storing electric charge supplied from said memory cell transistor, each of said dummy cells including a dummy cell transistor having a configuration substantially the same as a configuration of said memory cell transistors, at least a part of said dummy cell transistors constituting a driver circuit, for driving said memory cell section;

wherein each said dummy transistor has a first diffused region connected to a digit line of said memory cell array and a gate connected to a word line of said memory cell array; and wherein each said dummy cell transistor has a second diffused region connected through a first interconnect layer to a second interconnect layer disposed as overlying said storage capacitor, said first interconnect layer underlying said storage capacitor.

* * * * *